United States Patent [19]

Johnson et al.

[11] Patent Number: 4,686,639

[45] Date of Patent: Aug. 11, 1987

[54] FREE SPACE MICROSCOPE DIGITIZING AID

[75] Inventors: Charles A. Johnson, Hiawatha; Jerald A. Young, Marion, both of Iowa

[73] Assignee: Rockwell International Corporation, El Segundo, Calif.

[21] Appl. No.: 699,285

[22] Filed: Feb. 7, 1985

[51] Int. Cl.$^4$ .................. G01N 29/04; G01S 3/84; G06F 15/32

[52] U.S. Cl. ..................... 364/559; 73/625; 358/101; 364/561; 367/129

[58] Field of Search ............... 364/559, 561, 562, 525, 364/191, 516; 367/99, 108, 124, 129; 356/375; 181/124; 358/101; 901/46, 47

[56] References Cited

U.S. PATENT DOCUMENTS

| | | | |
|---|---|---|---|
| 2,721,315 | 10/1955 | Snyder | 367/129 |
| 3,445,808 | 5/1969 | Johnson | 367/129 |
| 4,202,037 | 5/1980 | Glaser et al. | 364/525 |
| 4,373,804 | 2/1983 | Pryor et al. | 901/47 |
| 4,488,173 | 12/1984 | Di Matteo et al. | 364/559 |
| 4,506,354 | 3/1985 | Hansen | 367/108 |
| 4,518,862 | 5/1985 | Dorn | 356/375 |
| 4,611,292 | 9/1986 | Ninomiya et al. | 364/559 |

Primary Examiner—Felix D. Gruber
Assistant Examiner—Daniel W. Juffernbruch

Attorney, Agent, or Firm—George A. Montanye; M. Lee Murrah; H. Fred Hamann

[57] ABSTRACT

There is disclosed an inspection system which allows the visual inspection of an item and the automatic recordation of the position of a defect or other inspection characteristic in the plane of inspection. In the visual inspection of an electronic circuit card, the card is inserted into a holder which maintains the card in a reference plane which is fixed relative to a plurality of sonic emitters. A microscope or other viewing device is fixed in a predetermined position on a support structure and includes cross hairs or other indicia to allow the visual identification of a particular point on an item that is to be visually inspected. A plurality of sonic receivers are coupled in predetermined positions on the support structure to receive sonic energy generated by the emitters. A manual control is coupled to initiate the production of sonic energy from the emitters while a digitizer and programmed microprocessor are coupled to receive signals from the sonic receivers in order to make a calculation of the position of each point visually observed on the inspection item. A complete history of the identified characteristics of an inspected item can be identified and stored with only simple movement of an item in the holder beneath the microscope to allow fast and easy visual inspection of a given item.

9 Claims, 3 Drawing Figures

FREE SPACE MICROSCOPE DIGITIZING AID

A listing of computer programs referenced in the disclosure is available as a microfiche appendix comprising one sheet of sixty-eight frames.

BACKGROUND OF THE INVENTION

The present invention relates to inspecting systems, and more particularly to automatic inspecting systems which enable the visual identification of inspected item characteristics at various positions on an item.

In the prior art there are known a variety of inspection systems which are used in electronics as well as other industries for enabling the inspection of products. In the electronic industry, such devices are particularly used to aid in the identification of defects in electronic circuit boards or aid in the identification of other characteristics which may be undesirable in circuit board construction. As will be apparent, identification of the defects is important in preventing the sale of faulty boards as well as in enabling their repair to reduce waste in the manufacturing process. Because of the nature of the defects which can occur, many systems are specifically tailored to the particular device to be inspected and are thus limited in their application and ease of use in many environments.

One type of inspection that has been used throughout the industry is visual inspection of the item itself. In its basic approach, such systems rely on the visual observation by a human operator of an item and a verbal or written description of the location of any fault or defect which may be observed. More sophisticated systems have employed an automated procedure wherein the position of the item relative to a specific point of observation can be automatically recorded and identified for subsequent replacement or repair of parts or correction of the defect. In one such system, a microprocessor is coupled to a cathode ray tube (CRT) and to a mounting system which includes a two-dimensional sonic digitizer. The circuit board is mounted with respect to the sonic digitizer so that the X-Y coordinates of components or joints in a plane of inspection can be viewed and identified by the operator through a microscope. Inspection is performed by prompting programs displayed on the CRT so that as the positions of defects are identified by the sonic digitizers in response to visual observation, the position of the defects as well as any necessary repair can be correlated automatically by the programming. In this system, however, for the inspection to be successful, the circuit boards must be held at right angles relative to the microscope or direction of viewing in order for the X-Y coordinates to be accurately obtained.

In more complicated systems, visual observation is eliminated by the implementation of a completely automatic system. In one such system, the solder joints of a circuit board are analyzed by indexing an ultrasonic probe to contact each solder joint. When in contact with the joint, the probe is excited and the response of the joint to the probe is analyzed in a programmed microprocessor. The system is restricted to the analysis of the particular circuit board configurations and is generally cumbersome in operation.

In another automatic inspection system, a raster scanning laser is used to heat each solder joint with the laser for a specified time period as the laser scans from joint to joint. An infrared scanner is used in connection with the laser scanning to detect the temperature rise of the joint in response to the laser heating. Properly soldered joints experience a predetermined temperature rise in a given time period. Therefore, solder joints which have temperatures falling outside the specified range for the predetermined period can be identified as defective. In operation, a microprocessor is used to monitor the raster scanning and infrared measurements to record the position and response of the solder joint to the laser and to compare those responses with a stored matrix obtained from a laser scan of a good circuit board. Such a system, however, is extremely expensive and cannot be used in a variety of environments in which inspection may be required.

In still other systems, electronic circuit boards can be excited with conventional test equipment to simulate circuit operation. In such systems, the responses of the circuits to the excitation can then be analyzed in a microprocessor and compared against a standard response for the particular circuit under inspection. In these instances, the microprocessor can also identify, based upon circuit response, the most likely components or connections that may have a defect needing repair. Again, however, such systems are relatively restricted in their applicability and generally costly in their implementation.

Accordingly, the present invention has been developed to overcome the specific shortcomings of the above known and similar techniques and to provide an improved visual inspection system which is easier to use, less costly in implementation, and allows inspection in a variety of different environments.

SUMMARY OF THE INVENTION

In accordance with the present invention, there is provided a system which provides three dimensional digitization of a point in space enabling the location of a position on a predetermined plane with respect to a fixed observation point. In one embodiment of the invention used for the inspection of electronic circuit boards, the circuit boards are placed in a holder which establishes a predetermined plane of the circuit board in a position perpendicular to a second plane in which are mounted a plurality of sonic emitters. An inspection station is created which includes a mounting structure to which is rigidly secured a plurality of sonic receivers and a microscope. The microscope includes cross hairs which allow the identification of a point for the visual observation of a particular position on the circuit board to be inspected.

The sonic emitters are coupled to be manually energized while the holder is positioned beneath the microscope to place the cross hairs at a selected position on the electronic circuit board. The sonic emitters and receivers are also electrically coupled through appropriate interfaces to an electronic digitizer which measures the time interval for the sonic signals (produced upon excitation of the sonic emitters) to reach the receivers. The signals from the digitizer are coupled to a microprocessor which mathematically determines the relative position of the emitters with respect to the receivers. The digitized position information received by the microprocessor can locate the X-Y coordinates of any identified point in the plane of the circuit board regardless of its orientation with respect to the cross hairs of the microscope so long as there is an unobstructed path between the sonic emitters and receivers. By comparing the points identified as defects against stored design data for the circuit board, an identification of the defective component or joint can be made and recorded automatically without rigid mounting requirements. The operator is therefore capable of more easily and accurately inspecting an item without the restrictions and expenses of prior art techniques.

It is therefore a feature of the invention to provide an easily implemented and less costly visual inspection system.

It is another feature of the invention to provide an inspection system which will allow the visual identification of points within a predetermined plane of an item to be inspected.

It is a further feature of the invention to provide a three-dimensional inspection system which allows visual identification of defects in an inspected item by movement of an item beneath the cross hairs of a microscope.

It is a still further feature of the invention to provide a visual inspection system which includes a plurality of sonic emitters and receivers coupled under microprocessor control to allow the identification of a point within a predetermined plane of an inspected item.

It is a further feature of the invention to provide a visual inspection system which can be implemented to identify any point on an inspected component while holding that component within a simple holding structure.

It is still a further feature of the invention to provide a simplified holding structure for use in connection with a visual inspection system wherein an item can be mounted in a predetermined plane with respect to the plane of a plurality of sonic emitters to allow an accurate identication of the position of points on the item.

It is yet a further feature of the invention to provide a visual inspection system which uses shielded sonic signals to enable the accurate calculation of positions representing points on an item to be visually inspected.

These and other advantages and novel features of the invention will become apparent from the following detailed description when considered in connection with the accompanying drawings wherein:

DETAILED DESCRIPTION OF A PREFERRED EMBODIMENT

Figure 1:
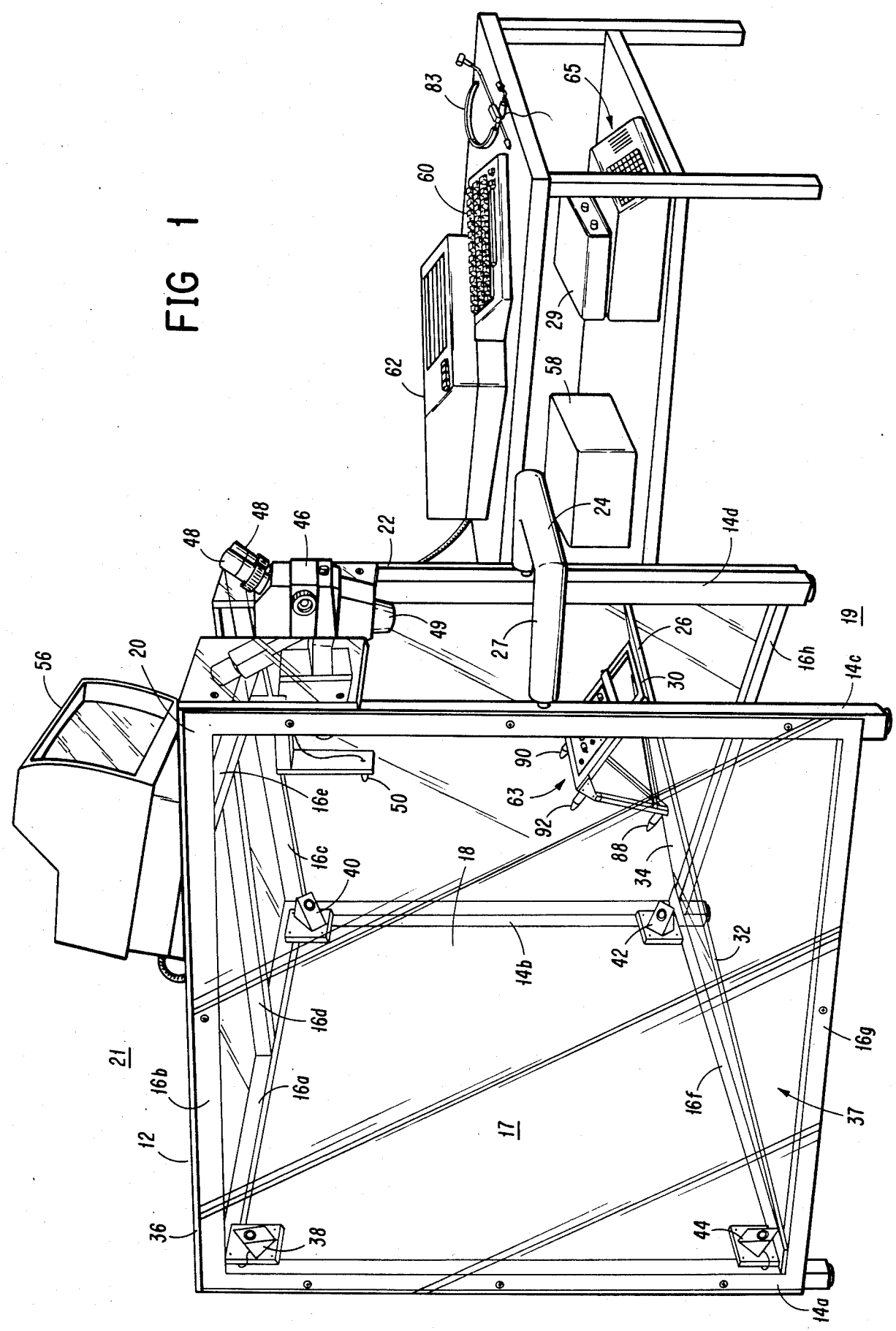
FIG. 1 is a perspective view of the inspection system in accordance with the present invention showing the general elements of the system.

Referring now to the drawings wherein like numerals are used to show like elements throughout, there is disclosed the inspection system in accordance with the present invention. Turning first to FIG. 1, there is shown a supporting structure 12 which includes a plurality of vertical members 14a–14d and horizontal members 16a–16h which are interconnected to form a generally trapezoidal configuration of support structure 12. The members 16a–16h and 14a–14d are shown in the drawing as elongate rectangular tubes which are interconnected at the joints by welding to form a rigid structure 12. A plate 18 is coupled to the supporting members 14a, 14b, 16a and 16f on a portion of the structure designated as the rear 17 of the structure to provide a vertical rear mounting surface of the structure extending between the identified members. The plate may be formed of any rigid material to which other items may be attached and can include a metal or plastic plate as desired.

Along each side of the structure, there are also attached vertical plates 20 and 22 which extend between the associated horizontal and vertical members 14 and 16 to define vertical sides. In the present embodiment, the plate members 20 and 22 are formed as transparent plexiglass sheets which serve to enclose the sides while allowing viewing of the interior of the space defined by the vertical plates 18, 20 and 22.

At the front 19 of the supporting structure, a generally U-shaped member 24 is coupled to the vertical members 14c and 14d to extend therebetween and define a generally horizontal support extending from the front vertical posts. The member 24 can be constructed from the same rectangular tubular material as the vertical and horizontal members 14 and 16 and welded to the upstanding vertical members 14c and 14d. Thereafter, a layer of padding 26 can be provided over the member 24 such that the member 24 serves as an arm rest during inspection. The height of attachment of member 24 above the floor or other support on which the structure 12 is resting may be arbitrarily set at that level which would normally serve to provide an arm rest for an operator sitting in a chair at the front 19 of the structure 12.

An angularly disposed metal or plexiglass sheet 26 (or other suitable material), which is configured to have a trapezoidal shape, is positioned within the support structure 12 and angularly oriented so that sheet 26 has a base 28 extending between the vertical members 14a and 14b at the rear 17 of the support structure 12, and a forward edge 30 which extends between the vertical members 14c and 14d at the front 19 of the structure 12. The sheet is angularly oriented so that the edge 30 is located in a horizontal plane vertically above the horizontal plane in which the base 28 is located so that the legs of an operator positioned in a chair and having arms resting on the member 24 will be able to extend unobstructed beneath the sheet 26. Likewise, the configuration of the sheet 26 is such that the sides 32 and 34 engage the adjacent respective sheets 20 and 22 between the vertical members 14a–14c and 14b–14d.

The structure 12 further includes an additional sheet 36 which is coupled between horizontal members 16a–16d at the top 21 of the supporting structure 12 to form a top member on the supporting structure 12. Thus, the sheets 18, 20, 22, 26 and 36 are coupled to the supporting structure 12 in such a manner as to form an enclosure 37 defined by those sheets, and which has an opening between the front vertical members 14c and 14d. As will be explained in more detail below, the enclosure provides an environment in which sonic energy can be generated and propagated without substantial interference from air currents, temperature or other external influences.

Within the enclosure 37 defined by the aforementioned sheets 18, 20, 22, 26 and 36, there are mounted four sonic receivers 38, 40, 42 and 44 which typically may be conventional microphones or similar devices. In the embodiment shown, each of the receivers 38, 40, 42 and 44 are mounted in a common plane on the back plate 18 at the four corners of the rectangle defined by the interconnection of the two vertical members 14a and 14b and two horizontal members 16a and 16b forming the back of the supporting structure 12. Each sonic receiver is positioned a predetermined distance from each of the other sonic receivers and electrically coupled to an electronic digitizer 29, such as that known as GP-8-3DP, manufactured by Science Accessories Corporation to enable the processing of position information as will be described in more detail below.

Figure 2:
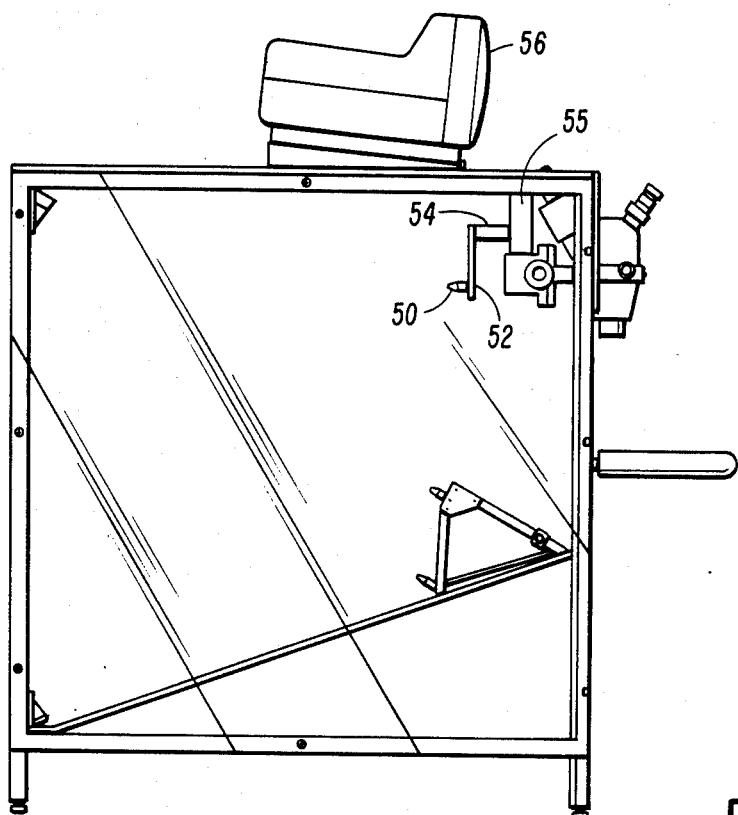
FIG. 2 is a side view of the supporting structure shown in FIG. 1.

At the front 19 of the supporting structure 12, a conventional microscope 46 is mounted to allow viewing vertically beneath the microscope through an optical lens 49 when an operator looks through the eyepieces 48 of the microscope. The microscope 46 may be attached in any conventional fashion so long as it is disposed in a rigid fixed position accessible by the operator. As is more clearly seen in FIG. 2, a reference sonic emitter 50 is rigidly mounted behind the microscope 46. The sonic emitter may be, for example, a conventional energy source manufactured by Science Accessories Corporation, which is mounted to perpendicularly project from a vertically extending rectangular support 52. Vertical member 52 is in turn mounted to a horizontal member 54 which extends from a vertical support 55 attached to one of the horizontal cross members 16e. While specific structure supporting the sonic emitter 50 has been shown, it is apparent that other means of support may be employed to mount the emitter 50 at a fixed reference position with respect to each of the receivers 38, 40, 42 and 44 to provide a reference emitter for calibration during operation as will be subsequently described.

Also shown in FIG. 1 is a conventional cathode ray tube display 56 which is placed for easy viewing by the operator on a top surface of plate 36 which can be a conventional compiler or be coupled to a conventional microprocessor 58, having a keyboard 60 coupled thereto, for processing the information received from the digitizer 29 during system operation. As will be apparent from the description below, peripheral equipment may be used in connection with the inspection system including a printer 62 and other devices (e.g., a voice recognition system 65) which provide output in response to the particular programming employed at the inspection station. Likewise, it will be apparent that the cathode ray tube 56 can be used to display instructions in response to program prompting to facilitate the testing procedure by guiding an operator through a preprogrammed set of instructions visually displayed by the CRT 56. The programming of the microprocessor is in accordance with the programs set forth in the microfiche appendix and is designed to produce a particular inspection technique which allows easy operator interface and prompting to facilitate the inspection procedure.

Figure 3:
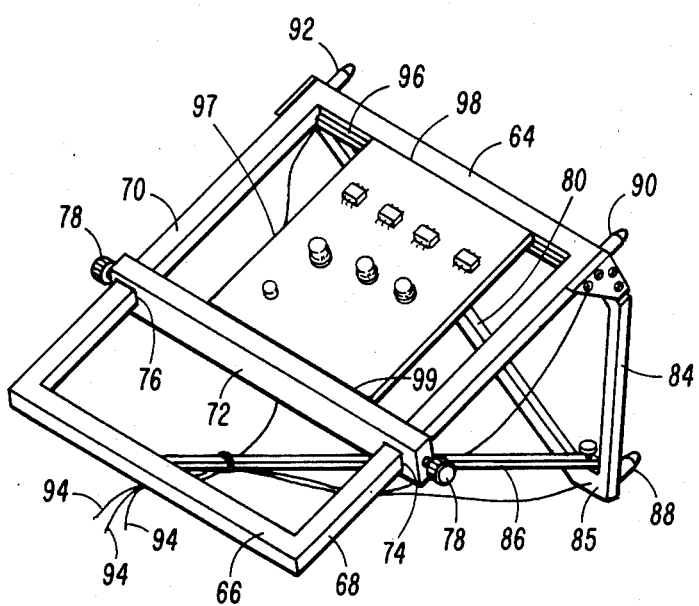
FIG. 3 is a more detailed perspective view of the item holder used in connection with the inspection system of FIG. 1.

Referring now to FIG. 3, there is shown a holder 63 which is used to mount the particular item to be inspected at the inspection station and define its cooperation with specific sonic emitters to enable the determination of points on the item as identified through cross hairs contained in the eyepieces of the microscope 46. More particularly, the specific configuration of the holder includes elongate rectangular members 64, 66, 68 and 70. Members 64 and 66 are parallel to one another as are members 68 and 70, and are so coupled to lie in the same plane to define a generally planar rectangular support. An elongate rectangular member 72 extends parallel to members 64 and 66 between members 68 and 70 and is journaled for movement on those members though openings 74 and 76 in the member 72. Retention screws 78 extend through opposite ends of the member 72 and are threaded in the ends of member 72 to engage the respective members 68 and 70 and frictionally hold the member 72 in a selectively fixed position.

Similar elongate rectangular members 80 and 84 are attached to the ends of the members 68 and 70 at their point of interconnection with the member 64. Members 80 and 84 angularly extend in a direction perpendicular to the plane defined by members 64, 66, 68 and 70 to intersect one another at 85. Members 80 and 84 form an isosceles triangle having a base defined by the member 64 and equal sides defined by members 80 and 84 lying in a plane which is perpendicular to the plane defined by members 64, 66, 68 and 70.

At each corner of the triangle defined by the interconnection of members 80 and 84 there is mounted a sonic emitter 88, 90 and 92, respectively. The emitters 88, 90 and 92 are identical to the emitter 50 and are placed at the corners of the triangle to extend from the holder 63 perpendicular to the plane defined by the triangle. The emitters 88, 90 and 92 are spaced by a predetermined distance from one another in the configuration described, and each of the emitters is electrically coupled, through appropriate wiring to the electronic digitizer 29 and schematically shown by wires 94, to be energized by a manual control which initiates the generation of sonic energy from each of the emitters. The holder 63 may also include a support member 86 which extends between members 66 and the interconnection 85 of members 80 and 84. This insures the rigidity of the holder and maintains the perpendicular relationship between the planes defined by the rectangular and triangular configurations of the members.

As will be appreciated, the holder 63 is designed to allow movement of member 72 to receive and mount an item to be inspected and hold that item in a fixed position during inspection. In the particular example, the member 64 includes a ledge 96 which extends between members 68 and 70 on which the forward edge of an electronic circuit board 97 can rest. A similar ledge on member 72 can be used to receive a rear edge 99 of the printed circuit board 97. Alternatively, a groove (not shown) in member 72 could also be employed to receive the rear edge 99 of the circuit board to clamp the circuit board between members 72 and 64 by tightening of screws 78. It will also be apparent that depending on the item to be inspected, the individual support members 64 and 72 could be configured to engage and retain an item of any configuration to rigidly clamp that item so that it is held in a plane parallel to the plane defined by the members 64, 66, 68 and 70. The surface of any item to be inspected is thus positioned to define a plane which is perpendicular to that plane in which the emitters 88, 90 and 92 are mounted.

Although not shown in the drawing, there is also employed, as part of the inspection system, a foot or hand operated switch which is coupled to the electronic digitizer 29 to initiate the generation of sonic energy from emitters 50, 88, 90, and 92 in response to the operator's visual identification of a point on the plane in which the item 97 is mounted. It will be apparent that the foot or hand operated switch could be replaced with any other operator controlled device to produce that initiation including voice responsive equipment and the like. It is only necessary that such operator controlled device be capable of initiating the generation of sonic energy through the digitizer 29 when the operator has positioned the item to be inspected beneath the cross hairs of the microscope and desires to identify that point on the item.

In operation, the inspection functions are initiated and controlled by the computer programs of the microfiche appendix in response to operator inputs. More particularly, the operator grasps the holder which has retained therein the item to be inspected, in this case a printed circuit board 97 having components soldered to the surface. Once the circuit board has been inserted and clamped in the indicated position in the holder, the operator places the holder 63 retaining board 97 beneath the microscope so that the surface of the board can be viewed through the eyepieces 48 to identify points on the board through lens 49 at the intersection of the cross hairs of the microscope.

The microprocessor also is operated to receive a data base including all of the position information of the individual components or points on the circuit board 97 which are to be inspected by the operator. This information is based upon the identification of three particular points on the circuit board 97 having a known position. Thereafter, once the circuit board 97 has been placed beneath the microscope, the computer program executes preliminary procedures which may vary from item to item, but which prompt the operator to perform the appropriate procedures to accomplish the required inspection. Included in these procedures is the identification of the points on the circuit board in the plane to be inspected.

In particular, in response to microprocessor prompting under the control of the programs of the microfiche appendix, the foot pedal is depressed by the operator while a designated one of the sonic emitters 88, 90 and 92 is held at an upper point along a line extending coaxial with the center line of the microscope's field of view. Following actuation of the foot pedal, that point is digitized by the activation of the sonic emitters and receivers and the calculation of position for that designated sonic emitter is performed by the programs of the microfiche appendix. Subsequently, the same designated sonic emitter is moved to a lower position on that same center line of the microscope's field of view. The sonic emitters are again energized and a second point in space is calculated for that designated sonic emitter through the action of the digitizer in cooperation with the programs of the microfiche appendix to define a line in space.

Thereafter, points on a circuit board are individually identified by the action of the three emitters 88, 90 and 92 coupled to the holder to define the circuit board 97 as a plane, and the intersection of that plane with the center line field of view as a point on the circuit board 97. Thus, after digitizing the two points representing the center line of the microscope's field of view, a plurality of known points (e.g., three) on the circuit board can be digitized to establish reference points in the inspection procedure which are the same known points stored in the microprocessor representing the actual layout of the circuit board 97. Thereafter, as the circuit board 97 is moved beneath the cross hairs of the microscope, any point of inspection on the surface of that circuit board 97 can be identified and stored merely by activating the foot switch or other mechanism which initiates the generation of sonic energy by the emitters 50, 88, 90 and 92 under the control of microprocessor 58.

In accordance with the programming, the foot switch is coupled to the electronic digitizer 29 so that the determination of time from emitter energization to time of receipt of the sonic energy at each of the three receivers can be coordinated and digitized to enable microprocessor 58 calculation of position on the surface of the circuit board 97. In accordance with the programs of the microfiche appendix, use of the three emitters 88, 90 and 92 in connection with at least three of the receivers allows the three dimensional calculation of position at a point on the circuit board 97 regardless of the orientation of the plane of the circuit board with respect to the cross hairs of the microscope so long as there is an uninterrupted path between the emitters and receivers. As a result, an operator can more easily inspect the surface of the circuit board in contrast to the prior art which required an absolute perpendicular orientation relative to the cross hairs of the microscope in the known two-dimensional system. This allows the inspection process to be performed with greater accuracy while imposing less tolerance on the absolute positioning of the circuit board beneath the cross hairs of a microscope. The inspection can thus be performed more simply and reduce the more costly construction required by the previously-referenced prior art systems.

The programs of the microfiche appendix are written in HP Basic language and designed to operate on a Hewlett-Packard Series 200 microprocessor coupled to receive inputs from the aforementioned digitizer to initiate the calculations and prompt further operator instructions through the programming. Such connections are conventional in computer control systems and require no further detailed explanation for an understanding thereof. In this particular example, the programs of the microfiche appendix also allow voice input to the microprocessor to describe those defects that may be determined in the inspection process. Furthermore, the microprocessor can provide specific instructions that can be displayed or conveyed to the operator by a synthesized voice through an associated headset 83 or microphone as may be desired. Since such functions are collateral to the inspection system, the same will not be described in great detail but are performed in an operable manner by those programs of the microfiche appendix cooperating with the described structure.

In accordance with the programs of the microfiche appendix there are included instructions which prompt the operator to digitize the previously described upper and lower points along the center line of the microscope. In the specific program of the microfiche appendix, this is performed three times for each of the points and the X, Y and Z values are averaged to establish the upper and lower points. Thereafter, the program goes through various routines which prompt the operator to digitize the aforementioned three known points on the circuit board 97. Another portion of the program calculates the X-Y position on the fixture from the distances between the emitters and receivers and the equation fixing center line of sight of the microscope. Thereafter, a still further portion of the program calculates the position on the board for the point identified by the cross hairs using the three known points digitized previously. A still further portion of the program converts the distances between emitters and receivers to inches for use in correlating with the stored data relating to identified positions on the circuit board 97.

The programs of the microfiche appendix further include a portion which allows the position calculation to be compensated for temperature and drafts that may affect the emitters and receivers. Specifically, that portion prompts the operator and controls the programming such that the reference emitter 50 is energized. Since the position of the reference emitter 50 with respect to each of the receivers is known, subsequent calculations using the movable emitters on the holder can be compensated for the effects of temperature and drafts within the enclosure 57. In this manner accurate calculations of the position identified on the circuit board 97 through the cross hairs of the microscope can be correlated with that same position represented by the data stored in the microprocessor. Thereafter the program, in response to the operator inputs (by voice or otherwise) identifying the particular defect in the circuit board, can indicate the repair necessary for that identified defect. Thus, the program also allows a complete repair matrix to be automatically generated in response to the operator identification of defects wherein the identified point on the circuit board is correlated with the defect and a computer-generated repair instruction for subsequent repair of the circuit board.

In the particular example, the programming is also configured to allow reinspection following repair of the circuit board. In this mode of operation, each of the uncovered defects can be rechecked and confirmed against a computer prompted checklist of those identified areas. Thus, both inspection and reinspection after repair are easily facilitated with less cost and complexity than those systems found in the prior art.

As will be appreciated from the above, the present invention allows substantially entire automatic control of an inspection process. The system is easily adaptable to a variety of items by reprogramming those portions relative to the particular data for the item to be inspected. Thus, the programming for calculating the position, compensating for temperature and drafts, would be common to any item, while the specifics with respect to the characteristics to be detected, the order of inspection, operator interface with the microprocessor, and a variety of other functions could be tailored to the particular inspection environment. This clearly provides improved versatility at less cost than those systems known in the prior art. All of these are features which are unrecognized or taught by any of the prior art.

Obviously, many other modifications and variations are possible in light of the above teaching. By way of example, the specific configuration of the supporting structure, receiver placement and emitter configuration could be changed and still accomplish the same objectives in locating a point on an item to be inspected. Likewise, the particular emitters, receivers, digitizers, and microprocessor could be varied and still achieve the same results. By way of example, the configuration of the emitters relative to the plane of the circuit board can be arranged to provide easy inspection of either side of a board merely by turning the board over. It will therefore be apparent that within the scope of the appended claims the invention may be practiced otherwise than as specifically described.

What is claimed is:

1. An inspection system comprising:
    means for retaining an item to be inspected in a position to define a plane of inspection;
    at least three sonic emitters coupled to said means for retaining in fixed relationship with respect thereto;
    means for viewing a point on said item to be inspected;
    means for energizing said sonic emitters to generate sonic energy;
    at least three separate receivers for receiving sonic energy from said at least three sonic emitters;
    means responsive to said means for energizing, said sonic emitters, and said receivers for defining a line of sight including said point of observation and for calculating the point of intersection of that line of sight with said plane defined by the item to be inspected to define the position of said point of intersection on said plane.

2. The system of claim 1 wherein said means for retaining includes a movable holding structure configured to define a first holding plane which retains an item such that it forms a plane of inspection parallel to said holding plane and defines a second plane perpendicular to said first plane, said at least three sonic emitters being mounted in said second plane.

3. The system of claim 2 wherein said first and second planes are orthogonal.

4. A method for inspecting an item comprising:
    positioning an item to be inspected to define a plane of inspection;
    positioning at least three sonic emitters in fixed relation with respect to said plane of inspection and movable therewith;
    positioning at least three receivers in fixed relationship with respect to one another;
    defining a line of sight intersecting said plane of inspection;
    viewing said item at a point of intersection between said line of sight and said plane of inspection;
    energizing said sonic emitters to produce sonic energy; and
    receiving said emitted sonic energy at said at least three receivers; and
    calculating the position of said point of intersection derived from said received sonic energy and representing the intersection of said line of sight with said plane of inspection.

5. The method of claim 4 wherein said step of defining a line of sight comprises:
    viewing at least one sonic emitter at an upper position along said line of sight and calculating its position;
    viewing said at least one sonic emitter along said line of sight at a lower position and calculating its position; and
    calculating a line forming said line of sight interconnecting said upper and lower positions.

6. The method of claim 4 wherein said steps of receiving and calculating comprise:
    receiving sonic energy representing the position of a known point on said item of inspection located at the intersection of said line of sight and said plane of inspection; and
    calculating the position of any identified position of the intersection of said line of sight and said plane of inspection with respect to said known position.

7. The method of claim 4 further comprising maintaining said sonic emitters in a common plane perpendicular to said plane of inspection.

8. The method of claim 4 further comprising enclosing said sonic emitters and receivers within an enclosure shielded from temperature variations and air currents.

9. The method of claim 4 wherein said step of viewing comprises viewing said item through a microscope having cross hairs defining said point of viewing.

* * * * *